United States Patent
Hsu et al.

[11] Patent Number: 6,150,252
[45] Date of Patent: Nov. 21, 2000

[54] MULTI-STAGE SEMICONDUCTOR CAVITY FILLING PROCESS

[75] Inventors: Wei-Yung Hsu; Qi-Zhong Hong, both of Dallas, Tex.

[73] Assignee: Texas Instruments Incorporated, Dallas, Tex.

[21] Appl. No.: 08/654,810

[22] Filed: May 29, 1996

Related U.S. Application Data

[63] Continuation of application No. 08/447,490, May 23, 1995, abandoned.

[51] Int. Cl.[7] ................................................. H01L 21/44
[52] U.S. Cl. ........................... 438/597; 438/623; 438/629; 438/644; 438/780
[58] Field of Search .................... 438/597, 623, 438/628, 629, 637, 642, 643, 644, 780

[56] References Cited

U.S. PATENT DOCUMENTS

| | | | |
|---|---|---|---|
| 5,008,216 | 4/1991 | Huang et al. | 437/190 |
| 5,011,793 | 4/1991 | Obinata | 437/203 |
| 5,073,518 | 12/1991 | Doan et al. | 437/225 |
| 5,308,792 | 5/1994 | Okabayashi et al. | 437/180 |
| 5,356,836 | 10/1994 | Chen et al. | 437/190 |
| 5,371,042 | 12/1994 | Ong | 437/203 |
| 5,401,675 | 3/1995 | Lee et al. | 437/203 |
| 5,523,259 | 6/1996 | Merchant et al. | 437/190 |

FOREIGN PATENT DOCUMENTS

| | | | |
|---|---|---|---|
| 0516344 | 12/1992 | European Pat. Off. | |
| 0099216 | 4/1989 | Japan | 437/212 |
| 0133923 | 5/1990 | Japan | 437/203 |

*Primary Examiner*—Tuan H. Nguyen
*Attorney, Agent, or Firm*—Stanton C. Braden; Wade James Brady, III; Richard L. Donaldson

[57] ABSTRACT

Cavities such as vias and contacts formed in semiconductor devices are filled in a multi-stage process to provide low resistance electrical connections. A liner is first deposited into the cavity at a relatively low power and deposition rate to enhance "wetting" of a subsequently deposited fill material. The fill material is deposited at a comparatively greater power and deposition rate to close the mouth of the cavity, after which the fill material is extruded at high pressure into the cavity to substantially fill the cavity. Relatively low processing temperatures and high pressures are utilized to allow for the use of lower dielectric constant dielectrics, which are thermally unstable at conventional processing temperatures.

10 Claims, 3 Drawing Sheets

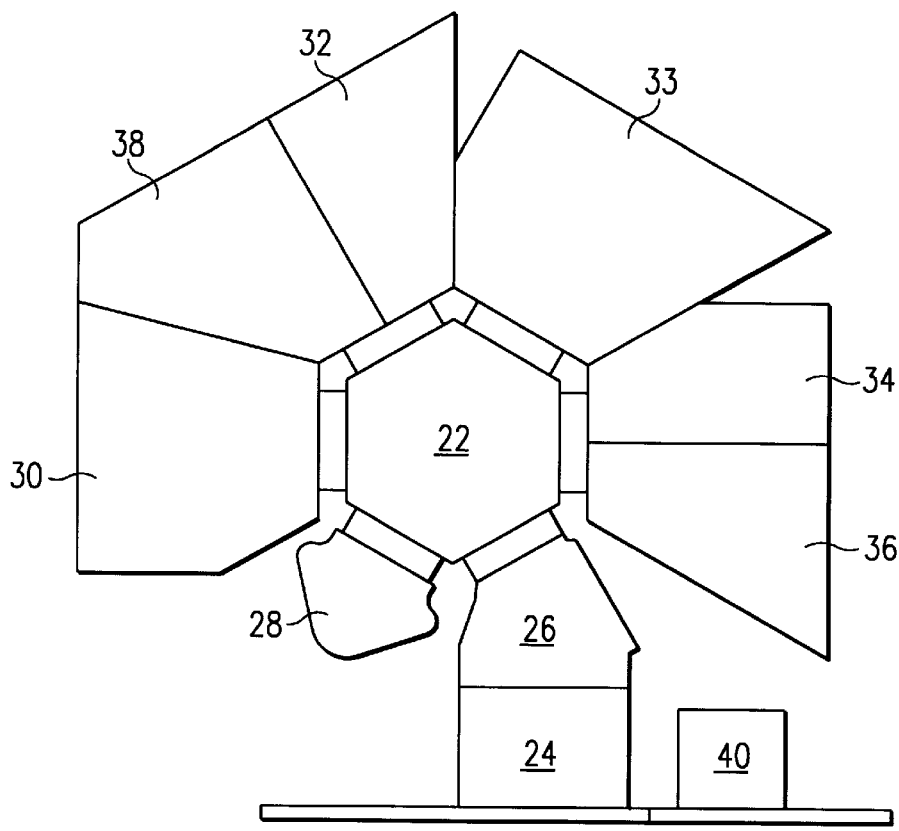
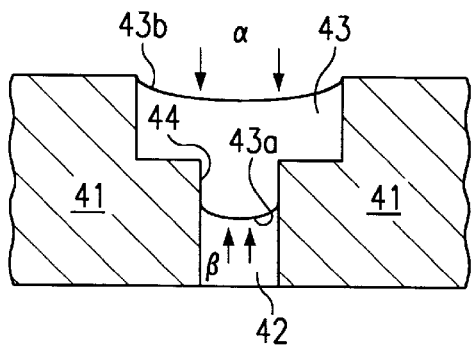
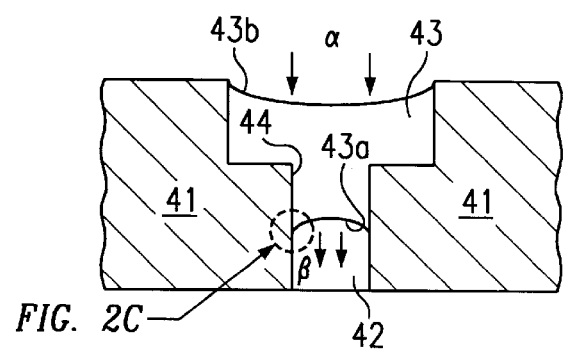
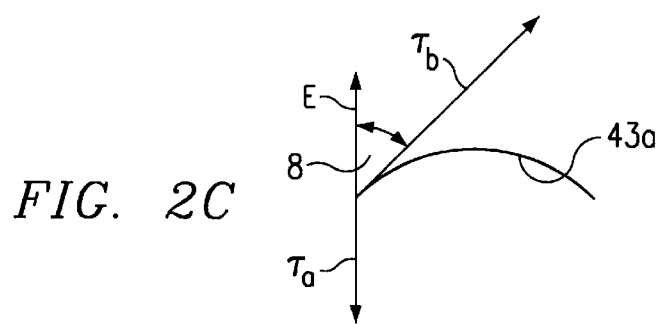
FIG. 2C

MULTI-STAGE SEMICONDUCTOR CAVITY FILLING PROCESS

This application is a Continuation of application Ser. No. 08/477,490, filed May 23, 1995, now abandoned.

TECHNICAL FIELD OF THE INVENTION

This invention relates to semiconductor manufacturing processes, and more particularly to processes for cavity filling between adjacent surfaces or levels of a semiconductor.

BACKGROUND OF THE INVENTION

Many obstacles exist to further miniaturization of semiconductor components. Among these obstacles include the filling of metal interconnect layers to insure proper operation of the devices. Metal interconnect signal lines establish contact with lower conductive layers of the integrated circuit through vias that are formed in an insulating layer. It is desirable to completely fill the via with the metal that is used to form the interconnect layer so as to ensure optimal operation of the device.

For reasons of its cost, physical properties and availability, aluminum is presently the metal of choice for the fabrication of metal interconnect lines in integrated circuits. The interconnect lines are typically formed by a sputtering process, which can result in less than optimal filling of the contact vias. For example, problems can arise from the accumulation of relatively large amounts of aluminum at the upper surface of the insulating layer. The accumulation of Aluminum at the edges of the contact via can block or otherwise obstruct the via prior to the delivery of aluminum in sufficient quantity to completely fill the via, resulting in the formation of voids and uneven structures within the via. This problem is particularly acute as integrated circuits are fabricated using smaller geometries. The finer dimensioned contacts that are used in smaller geometry devices, such as the current 0.5 $\mu$m and future generations of scaled technologies, necessarily have a larger aspect ratio (i.e., relationship of height to width) than do larger geometry devices, thereby exacerbating the via filling difficulties described above. For example, unduly large voids can result in contact resistance that is appreciably higher than designed. In addition, thinner regions of the aluminum layer adjacent to the via fill region will be subject to electromigration, which can result in the eventual opening of the circuits and failure of the device.

A number of different approaches have been attempted to ensure optimal metal contact at lower interconnect levels. For example, refractory metal layers have been used in conjunction with an aluminum interconnect layer to improve conduction throughout a via. In addition, via side walls have been sloped so as to improve metal step delivery into vias. The use of sloped side walls, however, has become less desirable as the industry adopts smaller device geometries. Even with the geometries above 0.5 $\mu$m, the foregoing techniques have not completely overcome the difficulties in the via filling. It is believed that the problem of via filling in the past has been at least partially attributable to the relatively low pressures and low temperatures at which the aluminum was processed incident to via filling. These temperatures typically are below 500° C., which some manufacturers believe contributes to the formation of aluminum grain sizes that are unduly large for via filling.

U.S. Pat. No. 5,108,951 to Chen, et al., which issued on Apr. 28, 1992, attempts to address the foregoing problem of via filling arising from the flow of aluminum grains of unduly large size. In the Chen patent, the temperature of the integrated circuit is heated to a temperature of about 400° C. prior to the commencement of aluminum deposition. Aluminum is deposited into the via at a rate of about 30–80 Å/sec during the course of wafer heating to a temperature of about 500° C. This prior art system shares many of the same disadvantages of the previously addressed prior art, namely incomplete via filling, particularly at smaller via geometries. In addition, via filling is undertaken at temperatures in the vicinity of about 500° C., which effectively prohibits the use as dielectrics of many of the new generation of low dielectric constant polymeric materials, as these polymeric materials typically decompose at such high temperatures.

In view of the foregoing deficiencies in the prior art, it is desirable to provide an integrated circuit filling process for contacts and vias which provides for a reliable filling at relatively low temperatures, preferably on the order of about 250°–400° C. or cooler. Contact and via filling at such low temperatures will permit for the use of lower dielectric constant dielectric materials such as parylene, aerogels and xerogels in semiconductor fabrication. The use of such low dielectric constant dielectrics is believed to constitute a significant aspect of the development of forthcoming generations of sub-0.5 $\mu$m technologies.

SUMMARY OF THE INVENTION

As a consequence of the foregoing prior art deficiencies, it is desirable to provide a process for the filling of integrated circuit contacts and vias which is operable at relatively low temperatures of on the order of 250°–400° C. or less, which temperature range will permit for the use of new generations of low dielectric constant polymers, such as parylene, aerogels and xerogels, the use of which has heretofore been limited due to the high temperatures required in prior art cavity filling processes.

It would also be advantageous to utilize a relatively low temperature cavity filling process that allows for filling with aluminum, alloys of aluminum, copper tantanum, copper and copper alloys in a manner that does not disturb other aspects of the semiconductor device. Contacts, trenches and vias (along with "holes" and "apertures" collectively referred to herein as "cavities") are filled with these metals in accordance with the present invention in a manner which renders a filled cavity having, for example, a via resistance in the range of about 0.4–1.9 $\Omega$/via that is considerably lower than that presently attainable ($\tilde{\ }$2–$\tilde{\ }$5 $\Omega$/via) for vias through prior art via filling practices.

In accordance with the present invention, an improved filling process is provided which allows for enhanced filling of contacts, trenches and vias that are formed in dielectrics of integrated circuits, particularly sub-0.5 $\mu$m technologies. The cavity fill is preferably accomplished in a two-step process: deposition of a relatively thin liner, followed by deposition of a thicker cavity fill layer to close the mouth of the cavity and high pressure processing to force the fill layer further into the cavity to complete cavity filling. In the first step, a relatively thin liner about 50–100 nm thick is deposited along the interior surface of the cavity. Deposition is preferably at a relatively low rate of about 1–2 nm-sec to provide for an enhanced conformity liner application. The liner can be applied by high density plasma sputtering, chemical vapor deposition or collimated cold sputtering at temperatures between about 250°–400° C. and vacuum pressures of 3–5 mTorr for PVD, or other suitable processes that are capable of depositing a substantially uniform thin metal layer with adequate conformity at temperatures between about 250°–400° C.

A second, thicker conductive metal fill layer is applied over the liner in sufficient quantity to substantially, and preferably completely, close the mouth or opening of the cavity. This second, thicker deposition is accomplished at a temperature in the range of about 250°–400° C. and at a relatively high deposition rate of about 15–20 nm/sec to facilitate cavity mouth closure. The second cavity fill can be applied by sputtering, chemical vapor deposition ("CVD"), or high density plasma fill processes at vacuum pressures of about 2–4 mTorr, and renders a layer that is about 500–550 nm thick to close the cavity mouth. The second deposition layer is driven into the cavity to substantially complete cavity fill upon the application of pressure in the range of 500–1,200 atm., and preferably in an inert or non-reactive atmosphere. A preferred pressure application range is 650–1,000 atm. The aggregate thickness of the cavity liner and fill layer applied in accordance with the foregoing teachings is about 550–650 nm.

Suitable materials for the cavity liner include: (1) Al—Cu (~0.5–~4%); (2) Al—Ge(~0.5–~5%)—Cu(~0–~4%); (3) $WSi_x$ (2<x<2.4); (4) $TiSi_2$; (5) Al—Sc(~0.1–~0.3%); (6) TiN; (7) TiW; (8) Tungsten; (9) Al(~1%)—Si(~1%)—Cu; (10) Al(~1%)—Si(~0.5%)—Sc; (11) Titanium; and (12) Titanium(~0–~25%)—Aluminum alloys, taken singularly or in combination with one another which render a resistivity preferably less than about 90 $\mu\Omega$-cm. Germanium and/or Silicon can be added as discrete liner layers to react with Aluminum that is deposited as a liner layer to lower the Aluminum melting temperature. Lowering of the melting temperature also lowers the processing temperature through lowering of the flow stress needed to deform the second Aluminum alloy and extrude the Aluminum alloy into the cavity. The second, fill layer can be comprised of the following metals: (1) Al—Cu(~0.5–~4%); (2) Al—Ge (~0.5–~5%)—Cu(~0–~4%); (3) Al—Sc(~0.1–~0.3%); (4) Al(~1%)—Si(~1%)—Cu; and (5) Al(~1%)—Si(~0.5%)—Sc, taken singularly or in combination with one another which render a resistivity preferably less than about 3.5 $\mu\Omega$-cm. Cavity filling in accordance with the present invention is in sharp contrast to that of the prior art, which typically provides for cavity fill deposition and extrusion at a mere fraction of an atmosphere (typically on the order of about 1–4 mTorr at comparable vacuum levels), and temperatures typically in excess of about 500° C. The process of the present invention is applicable for the foregoing metals and metal alloys, adjustments to the processing parameters disclosed above being undertaken in accordance with such factors as the various physical and chemical properties of the material to be filled into the respective cavities.

The processing regimen of the present invention is particularly advantageous when processing integrated circuits having polymeric insulators, since such insulators typically decompose at temperatures of about 400° C. or greater. Such polymeric insulators include, by way of non-limiting example, the family of polytetrafluoroethylene ("PFTFE") compounds, which exhibit a dielectric constant ($\kappa$) of about 1.9, parylene ($\kappa$=~2.2–2.6), aerogels and xerogels ($\kappa$=~1.1 to 1.8), all of which are therefore very attractive because of their ability to reduce parasitic capacitance of interconnects. Other suitable dielectric materials for use in the present invention include the family of polymeric spin-on-glass ("SOG") materials, such as the 1,500 series manufactured by Allied Signal Corp.; the family of PTFE compounds; parylene; polyimides; hydrogen silsesquioxane; aerogels and surface modified aerogels such as fluorinated and methylated aerogels, all of which are more fully described an incorporated herein by reference in one or more of the following copending patent applications: (1) Ser. No. 08/234,100 filed Apr.28, 1994 and entitled "Self-Aligned Via Using Low Permittivity Dielectric"; (2) Ser. No. 08/286, 761 filed Aug. 5, 1994 entitled "Porous Dielectric Layer With A Passivation Layer For Electronics Applications"; (3) Ser. No. 08/294,290 filed Aug. 23, 1994 entitled "Self-Aligned Contact Using Organic Dielectric Materials"; (4) Ser. No. 08/246,432 filed May 20, 1994 entitled "Interconnect Structure With An Integrated Low Density Dielectric"; and (5) Ser. No. 08333,015 filed Nov. 1, 1994 entitled "Pillars For Improved Damascene Conductor Fabrication".

The processing techniques of the present invention are also applicable to ensure complete filling of cavities that are formed through various dielectic materials or combinations of dielectic materials. As such, the processing techniques of the present invention are applicable for the family of damascene and dual damascene processing techniques, in which a groove is mechanically abraded, etched or otherwise formed in an oxide or other dielectric, then filled with a metal (usually tunsten or copper) in an appropriate deposition process, such as chemical vapor deposition ("CVD"), after which the applied metal is polished or otherwise abraded so as to be substantially flush to the surface of the dielectric. In the dual damascene process, not only is a groove abraded, etched or otherwise formed in the dielectric, but in addition thereto a via is patterned and etched so as to extend from an upper level of metal through the dielectric to a lower level of metal. All of the dielectrics identified above are suitable for use in the damascene and dual damascene processes in accordance with the teachings of the present invention.

BRIEF DESCRIPTION OF THE DRAWINGS

These and other features of the invention will be apparent to those skilled in the art from a reading of the following detailed description of the invention, taken together with the accompanying drawings, in which:

FIG. 1 represents a schematic illustration of a high pressure processing system for use in practice of the present invention;

FIGS. 2A–2C represent schematic illustrations of principles of cavity fill in accordance with the teachings of the present invention;

DETAILED DESCRIPTION OF THE PREFERRED EMBODIMENTS

Figure 3A:
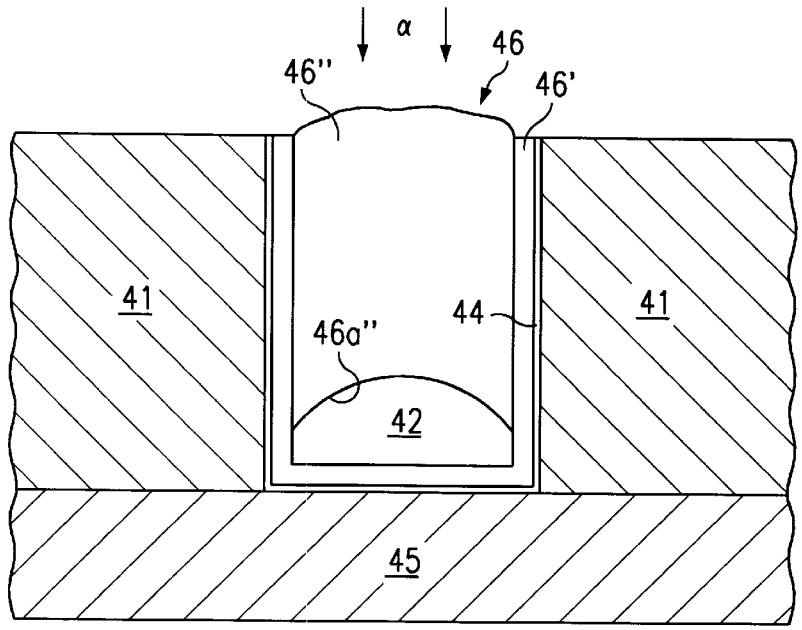
FIGS. 3A and 3B are cross-sectional views of cavity filling in accordance with embodiments of he present invention.

It is to be understood and appreciated that the process steps and structures described below do not form a complete process flow for the manufacture of integrated circuits. The present invention can be practiced in conjunction with integrated circuit fabrication techniques that are currently used in the art, and only so much of the commonly practiced process steps are included herein as are necessary to provide an understanding of the present invention. The drawing figures that are included with this specification and which represent cross-sections of portions of an integrated circuit during fabrication are not drawn to scale, but instead are drawn so as to illustrate the relevant features of the invention.

Aluminum reflow for contact/via filling in 0.5 $\mu$m applications has been previously demonstrated. However, aluminum reflow processes have not been widely accepted due to the higher deposition temperatures required and the difficulty in globally filling the high aspect ratio contacts and vias of ULSI circuits. Global filling is of particular concern for sub-0.5 $\mu$m applications, since a viable aluminum reflow technology must be capable of achieving equivalent or better yield and reliability as compared to conventional tungsten plug technology. The processes of the present invention demonstrate that enhanced aluminum fill at temperatures less than 400° C. is indeed a viable process for sub-0.5 $\mu$m applications.

The advantages of an aluminum fill technology compared with integrated W-plug/aluminum leads include lower resistance contacts/vias, fewer overall process steps and improved electromigration performance. One of the principal disadvantages of conventional aluminum reflow processes has been their sensitivity of reflow to surface conditions and hole profile. Conventional hot sputter deposition and/or reflow processes rely on the diffusive mobility of the adatoms. Higher contact/via aspect ratios and the typical protrusion of sputtered barrier layers at the hole entrance adversely affect reflow characteristics. As a consequence, global filling has been difficult to achieve on a regular, reproducible basis.

Various aspects of low temperature, high pressure cavity fill processes have been demonstrated in co-pending patent application Ser. No. 08/354,590 of G. Dixit and R. Havemann, both of Texas Instruments, entitled "High Pressure, Low Temperature Semiconductor Cavity Filling Process" filed on Dec. 12, 1994, the disclosure of which is hereby incorporated by reference. In the Dixit-Havemann patent application, cavity fill data using identical Al—Cu alloys is provided, and electromigration reliability data for metal leads and vias is also presented, demonstrating the efficacy of high pressure, low temperature processing.

The present invention provides, among other things, a global aluminum aperture or gap fill technology that is capable of achieving substantially complete filling of high aspect ratio sub-0.5 $\mu$m apertures or gaps at temperatures below 400° C., thus permitting the use of newer generation dielectrics, such as parylene, aerogels and xerogels. These materials, while affording advantageously low dielectric constants ($\kappa$) of less than about 2.5, unfortunately decompose at conventional fill processing temperatures, which presently range from about 400°–550° C. As a consequence, it has not been possible to fully utilize these materials in semiconductor design.

With reference to the drawings, wherein like reference characters represent like components throughout the various figures, and with particular reference to FIG. 1, there is depicted by numeral 20 an example of a high pressure processing system, such as those manufactured by Applied Materials, Inc. of San Jose, Calif. and Electrotech Ltd. of Bristol, U.K., that can be used to implement some of the processing measures of the present invention. The depicted high pressure system 20 is provided with a generally hexagonal, "hub and spoke" configuration, and includes a cassette handler 22 that is operable to convey one or more semiconductor wafer cassettes (not shown) from a cassette loading zone 24 through a pressure variable loading dock 26. The loading dock 26 is operable to cycle between different levels of vacuum as the cassettes are transported by the handler 22 between different process chambers, as will be described below.

The cassette handler 22 is configured as a rotatable, extendible arm that is operable to transfer wafers from cassettes to the process chambers and back to cassettes as the wafers are processed by the device. A heating station 28 is provided to implement preliminary thermal processing that may be desired for the cassettes of wafers transported by the handler 22. The wafers can be transported by the handler 22 to a physical vapor deposition ("PVD") station 30 for the deposition of cavity liner metals in accordance with the present invention. Alternatively, as will be explained below, the cassettes can be transferred by the handler 22 to one or more of the following stations for application of the cavity fill materials in accordance with the present invention: chemical vapor deposition ("CVD") station 32, high power/rapid deposition PVD station 33, soft sputter etch station 34; high density plasma sputter station 36; and high pressure processing station 38. Etch chamber 34 can optionally include a heating station (not shown) to facilitate thermal processing of the wafers during etching. A monitor 40 can optionally be connected to various control apparatus to provide a display of the progress of wafers through the device 20.

Conventional via and similar cavity filling procedures, such as those used to fill electrical contact paths, typically utilize Aluminum alloys in a high pressure extrusion process that operate at temperatures in the vicinity of about 450° C. or higher. However, such elevated temperature processing is incompatible with the new and contemplated future generations of low dielectric constant materials, which feature decomposition temperatures under 400° C. For example, the dielectric paralyne features a dielectric constant $\kappa$ is of about 2.2–2.6. Other dielectrics, such as aerogels and xerogels, have even lower decomposition temperatures (less than 400° C.) and a lower dielectric constant $\kappa$ of about 1.1–1.9.

With reference to FIG. 2A, a portion of a silicon wafer is illustrated following conventional processing, such as processing through a 0.35 mm CMOS Double-Level-Metal (DML) flow (not shown) utilizing chemical mechanical planarization of the poly-metal-dielectric (PMD) and interlevel-metal-dielectric (IMD). Contacts, vias and trenches, such as via 42 shown in the drawing, can be patterned in a dielectric layer 41 in a conventional manner, such as through use of phase shifted I-line lithography followed by plasma etch.

Complete filling of cavities, such as via 42, is affected by the thermal budget for the processing regimen. When processing temperatures are lowered from the 400°–500° C. range to the range of about 250°–400° C. that should be implemented to fully utilize the new generation of low dielectric constant dielectrics (i.e., dielectrics having $\kappa$<~2.5), it becomes more difficult to accomplish complete via filling as a result of the reduction in thermal and related forces that are available for application to the fill material under these modified conditions.

Cavity fill is further affected by the "wetting or "dispersibility" between the fill metal and the material with which the fill metal contacts in the cavity 42. Material "wetting" relates to the ability of the material to cover a surface. The wetting between two materials is a function of the material surface tension and the interface energy. The affect of these parameters on cavity fill is graphically illustrated in FIGS. 2A–2C. In FIG. 2A, poor wetting between the fill material 43 and the cavity inner wall 44 is illustrated. Poor material wetting impedes the flow of material 43 into the cavity due to the frictional force (β) between the material 43 and the cavity wall 44, which opposes the application force (α) directing the material into the cavity. As a consequence, lead surface 43a of the fill material exhibits a convex contour, as the material resists engagement with the cavity wall 44. Trailing or upper fill material surface 43b exhibits a concave contour as a result of the net flow force (F) applied to the fill material. Thus, the flow force (i.e., the force (F) that must be overcome to direct the fill material 43 into the cavity 42) is related to the sum of the application (α) and frictional (β) forces.

In contrast to the fill illustrated in FIG. 2A, optimal wetting of a fill material, as illustrated in FIG. 2B, is related to the difference between the application force (α) and the frictional force (β). The lead surface 43a of the fill material exhibits a concave contour due to increased surface engagement with the cavity wall. It is therefore desirable to select materials for the fill material and the cavity wall which exhibit a low interface energy, the selection of which would allow for optimal wetting and a diminution in processing temperature. This is graphically illustrated in FIG. 2C, in which E represents "interface energy," δ represents "contact angle" (i.e., the angle between the adjacent wall (such as cavity wall 44) and the applied material 43), $\tau_a$ represents stationary material (i.e., cavity wall 44 in FIG. 2A) surface tension, and $\tau_b$ represents the surface tension of the applied material 43. Interface energy (E), contact angle (δ) and the respective surface tensions ($\tau_a$, $\tau_b$) are related by the following equation:

$$\tau_a = E + \tau_b \cos \delta$$

Therefore, as the value of interface energy (E) approaches zero, the contact angle δ approaches zero. The interface energy E that is associated with application of a cavity fill material (as would occur incident to the filling of vias, contacts, trenches and the like), can be lowered through the application of the fill material in a two-stage, bi-layer process in accordance with the practice of the present invention.

Figure 3B:
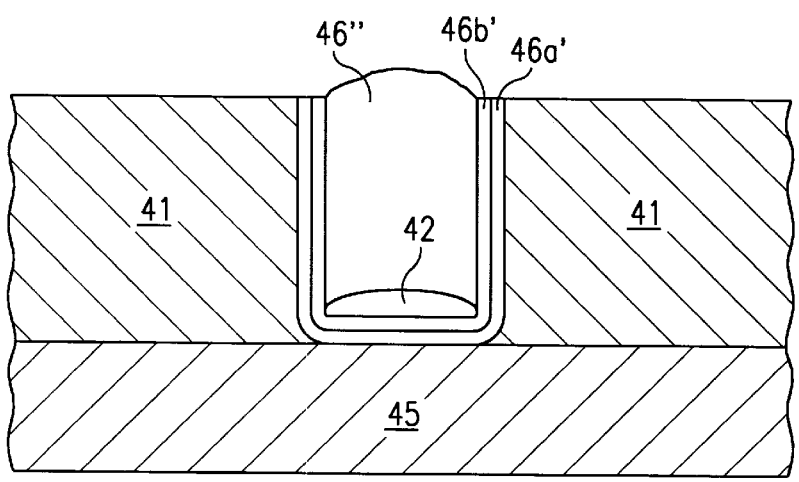

With reference to FIGS. 3A and 3B, in which the dimensions and dimensional relationships of the illustrated components have been exaggerated for clarity, there is depicted a via 42 that is formed in a dielectric layer 41 overlying a layer of Silicon 45. The dielectric layer can be comprised of any of a variety of known dielectrics having favorable electrical and processing characteristics, and can optionally be in the form of one of the newer generation low dielectric constant (κ) dielectrics (i.e., κ<~2.5) mentioned previously, for which the practice of the present invention is particularly advantageous.

The cavity fill material, designated generally by reference numeral 46, is in the form of a multi-level structure in which a cavity liner 46' is provided to facilitate wetting of a subsequently-applied second fill layer 46", and thus optimize electrical conduction across the filled cavity. The liner 46' comprises a metal or metal alloy, such as: (1) Al—Cu (~0.5–~4%); (2) Al—Ge(~0.5–~5%)—Cu(~0–~4%); (3) WSi$_x$ (2<x<2.4); (4) TiSi$_2$; (5)Al—Sc(~0.1–~0.3%); (6) TiN; (7) TiW; (8) Tungsten; (9) Al(~1%)—Si(~1%)—Cu; (10) Al(~1%)—Si(~0.5%)—Sc; (11) Titanium; and (12) Titanium (~0–~25%)—Aluminum alloys, any of the foregoing materials (1)–(12) being taken singularly or in combination with one another in a manner which facilitates "wetting" of an alloy second layer 46" formed from any one or more of the foregoing metal alloys to fill the via 42, as will be described in greater detail below. The applied liners preferably exhibits a resistivity that is less than about 90 μΩ-cm.

In instances where the liner 46' is configured as an alloy liner (FIG. 3B), the liner can be applied in discrete overlying metal layers 46'a and 46'b which react to produce a liner of substantially uniform composition. For example, a Ti—Al liner can be formed by first depositing a 5–10 nm thick layer of Titanium, followed by deposition of an Aluminum layer up to about 100 nm thick. The deposited liner layers react with one another to render a substantially uniform Ti—Al liner having an Al:Ti ratio of about 10–20:1. The Titanium liner layer can be applied at a temperature of up to about 350° C. in a vacuum of about 3–5 mTorr. The Aluminum liner layer can be applied at a temperature of up to about 300° C. at a vacuum of about 3–5 mTorr. Germanium and/or Silicon can be applied in the foregoing manner as discrete liner layers to react with Aluminum that is deposited as a liner layer to lower the Aluminum melting point and thereby lower its flow stress to further facilitate uniform deposition along the surface of the cavity.

The liner 46', as well as any of the liner component layers described above, is preferably deposited at a temperature of no more than about 350° C. at a deposition rate of about 1–2 nm/sec to permit for higher conformity metal deposition within the cavity. Such deposition can be accomplished by high density plasma sputtering, chemical vapor deposition, collimated cold sputtering, or other suitable low temperature processes in dedicated stations 30–38 in the high pressure processing system 20 (FIG. 1) or other suitable apparatus that are capable of rendering a relatively uniform conductive metal layer 46' that is between about 50–100 nm thick along the surface 44 of the cavity.

A second, comparatively dense cavity fill layer 46" can be deposited in overlying relation with the liner 46' by way of sputtering, chemical vapor deposition, or high density plasma deposition in accordance with the processing station selected from the wafer processing system 20. As is shown in the drawing of FIG. 3, the applied second layer 46" is then driven into the cavity 42 at a pressure α that is sufficient to overcome the resistive force β to the inflow. Optimal wetting between the second layer 46" and the liner 46' can be obtained as a result of the bi-layer fill, as the second, bulk metal layer 46" bonds more readily to the liner 46' than the layer 46" would bond to the cavity wall 44, as indicated by the concave configuration of lower surface 46"a of the second layer. The second layer 46" is preferably applied at a relatively high deposition rate of about 15–20 nm/sec at a temperature of about 350°–400° C. at a vacuum pressure of about 2–4 mTorr to ensure cavity mouth closure.

Figure 4:
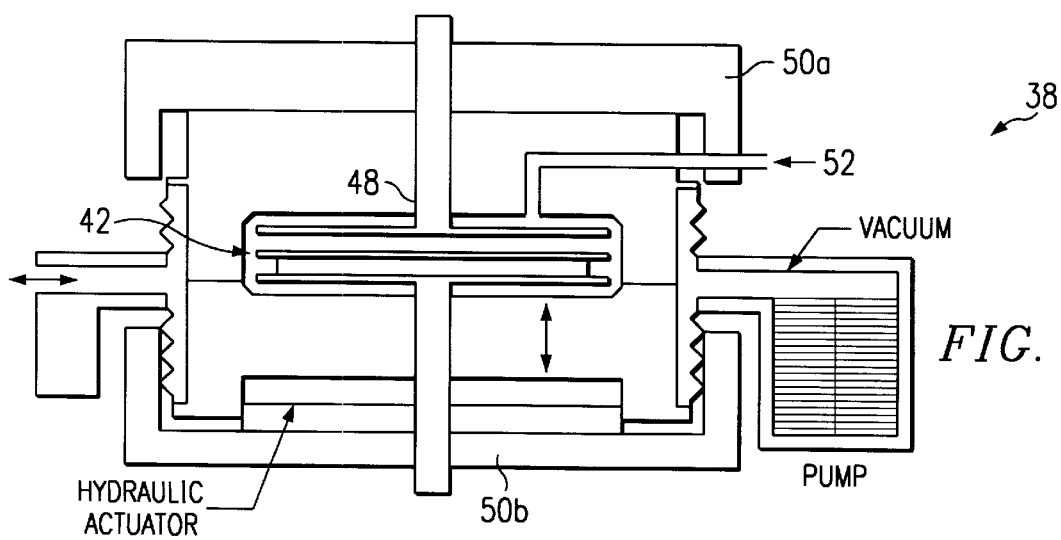
FIG. 4 is a schematic illustration of a high pressure module.

The second cavity fill layer 46" is preferably provided at a thickness of about 450–550 nm to render a total cavity metal fill of about 500–600 nm. The liner 46' provides a continuous conduction path across the via, even in instances where minor voids are present between the second layer 46" and the liner 46'. Cavity fill is completed by application of pressure of about 500–1,200 atm, and preferably in the range of 650–1,000 atm., in a non-reactive, preferably inert gas, environment. Preferred inert gasses include helium and argon. The temperature and pressure parameters can be varied in accordance with such variables as the respective compositions of the liner 46' and second fill layer 46" materials, and the like. Such high pressure processing can be accomplished under vacuum in a high pressure module 38 of the type discussed previously in connection with FIG. 1. Such a pressure module 38, as is more fully illustrated in FIG. 4, can include a high pressure chamber 48 having two radiant heaters 50a and 50b that are operable to provide for control of wafer processing temperature. The second fill layer 46" can be forced into the semiconductor cavity 44 and associated liner 46' by pressurizing the chamber 48 with a suitable non-reactive or inert gas, such as argon, delivered through inlet 52, to accomplish substantially complete cavity filling.

The second layer 46" preferably comprises Aluminum, or an alloy such as any one of the following alloys: (1) Al—Cu(~0.5–~4%); (2) Al—Ge(~0.5–~5%)—Cu(~0–~4%); (3) Al—Sc(~0.1–~0.3%); (4) Al(~1%)—Si(~1%)—Cu; (5) Al(~1%)—Si(~0.5%)—Sc, or various combinations of the above which render a fill material exhibiting a resistivity that is preferably less than about 3.5 $\mu\Omega$-cm. In a preferred aspect of the invention, the first and second cavity fill layers 46' & 46" are formed of identical, or substantially identical, metal alloys so as to optimize wetting and minimize electrical resistance of the filled cavity.

Figure 5A:
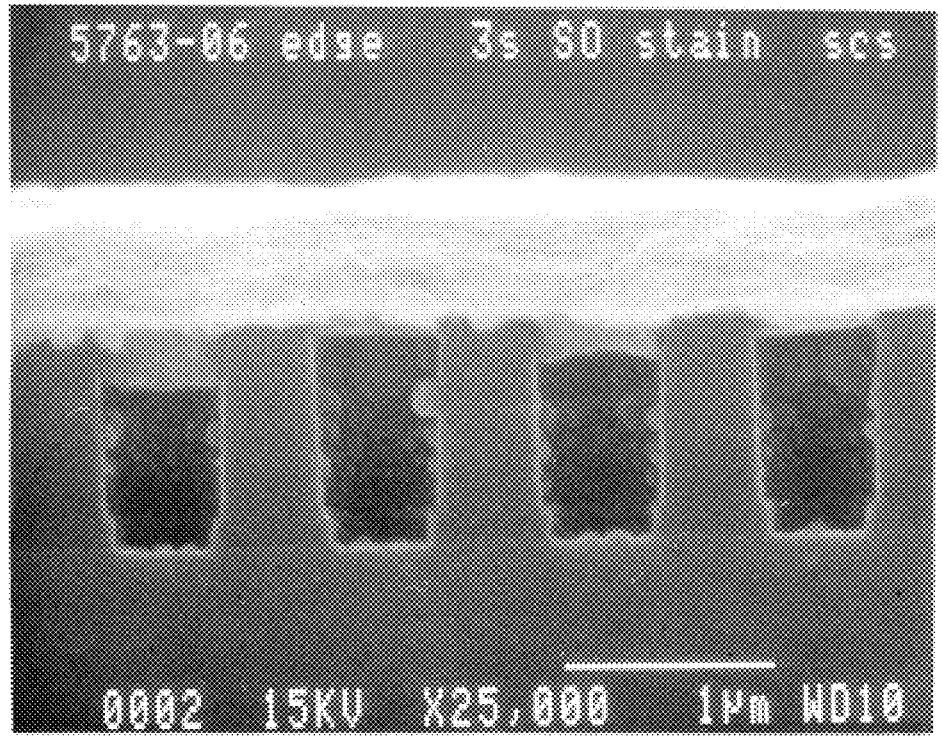
FIG. 5A is a Scanning Transmission Micrograph ("STM") of filled vias that do not include the process features of the present invention.
Figure 5B:
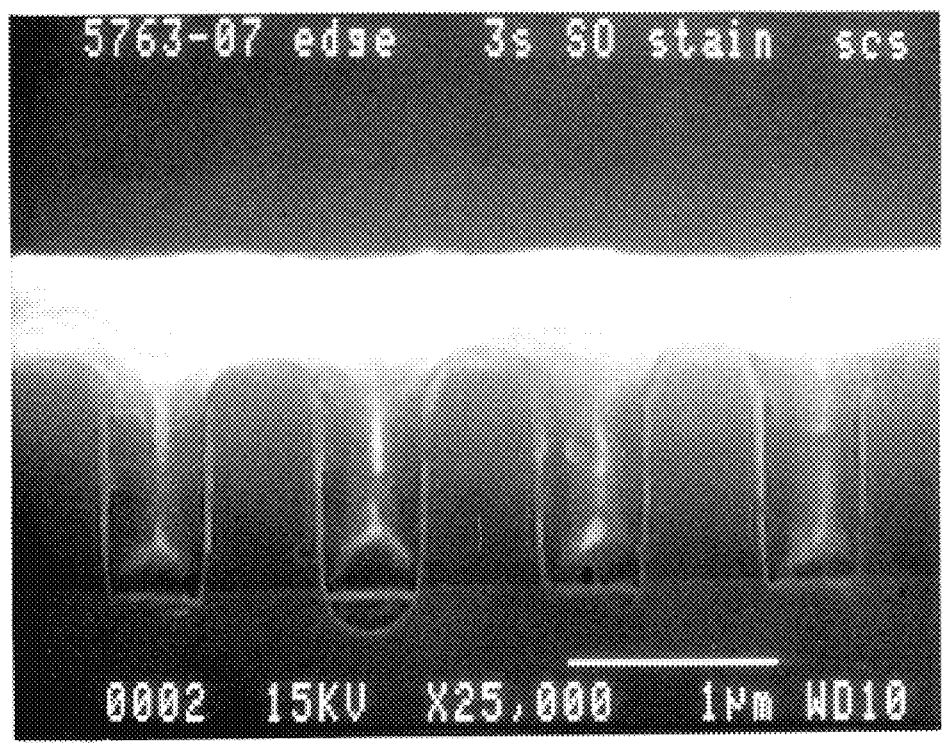
FIG. 5B is an STM of high pressure filled vias that do include the process features of the present invention.

FIGS. 5A and 5B illustrate SEM cross sections of filled high aspect ratio vias. In both instances, the vias extend through a BPSG-TEOS dielectric which overlies a Silicon layer. In FIG. 5A, high pressure cavity fill is attempted in the absence of a "wetting" enhancing liner, resulting in incomplete cavity fill due to incomplete and irregular wetting of the fill material with the cavity walls. The darkened, irregular shaped portions appearing in each via are cavity voids where fill material did not flow. The illustrated via fill was accomplished by baking wafers at a temperature of about 380° C. for a period of about four min., followed by via fill by deposition at a temperature of about 350° C. of Al—Cu (~0.5%) and high pressure extrusion at a pressure of about 650 atm. for about 1–3 minutes in Argon. No such darkened portions appear in FIG. 5B, which demonstrates the enhanced aluminum fill technique of the present invention, as substantially uniform via fill has been accomplished. Cavity fill was accomplished in FIG. 5B by baking the wafers at a temperature of about 350° C. for a period of about four minutes, followed by sputter deposition of Titanium and TiN liner layers. An Al—Cu(~0.5%) alloy was deposited by sputtering at a temperature of about 350° C., after which the Al—Cu was extruded in an Argon atmosphere into the via at a pressure of about 650 atm.

Although the present invention and its advantages have been described in connection with the preferred embodiments, it should be understood that various changes, substitutions and alterations can be made herein without departing from the spirit and scope of the invention as defined by the appended claims.

What is claimed is:

1. A process for filling a cavity in a semiconductor body, comprising the steps of:
   providing a body for a semiconductor device, said body comprising a dielectric layer comprised of a polymeric material having a dielectric constant no greater than about 2.8, said body having an upper surface and at least one cavity which extends from said surface at least partially into said body, said cavity being defined by a cavity wall and having an open end;
   depositing a cavity liner along at least a portion of said cavity wall, said cavity liner being comprised of at least one metal-containing layer that is deposited along said cavity wall at a temperature that is below the melting point of said metal-containing layer; and
   applying a cavity fill metal under positive pressure into said cavity at a temperature below the melting point of said metal-containing layers.

2. The process according to claim 1, wherein said cavity liner comprises at least one of the following metal-containing materials: (1) Al—Cu(~0.5–4%); (2) Al—Ge (~0.5–~5%)—Cu(~–4%); (3) WSi$_x$ (2<x<2.4); (4) TiSi$_2$; (5) Al—Sc(~0.1–~0.3%); (6) TiN; (7) TiW; (8) Tungsten; (9) Al(~1%)—Si(~1%)—Cu; (10) Al(~1%)—Si(~0.5%)—Sc; (11) Titanium; and (12) Ti(~0–~25%)—Al, taken singularly or in combination with one another.

3. The process according to claim 1, wherein said dielectric layer comprises at least one of the family of polytetrafluoroethylene compounds, aerogels, xerogels and parylene.

4. The process according to claim 1, wherein said cavity liner is in the form of a composite liner comprised of discrete, separately applied liner layers.

5. The process according to claim 4 wherein said cavity liner layers are reacted with one another to form a substantially homogeneous composite liner.

6. The process according to claim 1, wherein each of said cavity liner and said cavity fill metal is applied to said cavity at a temperature that is below the melting point of applied material.

7. A process for filling a cavity in a semiconductor body, comprising the steps of:
   providing a body for a semiconductor device, said body comprising a dielectric layer comprised of at least one of the family of polytetrafluoroethylene compounds, aerogels, xerogels and parylene, said body having an upper surface and at least one cavity which extends from said surface at least partially into said body, said cavity being defined by a cavity wall and having an open end;
   depositing a cavity liner along at least a portion of said cavity wall, said cavity liner being comprised of at least one metal-containing layer that is deposited along said cavity wall at a temperature that is below the melting point of said metal-containing layer; and
   applying a cavity fill metal under positive pressure into said cavity at a temperature below the melting point of said metal-containing layers.

8. The process according to claim 7, wherein said cavity liner is in the form of a composite liner comprised of discrete, separately applied liner layers, at least one of said liner layers being comprised of at least one of the following metal-containing materials: (1) Al—Cu(~0.5–4%); (2) Al—Ge(~0.5–~5%)—Cu(~0–4%); (3) WSi$_x$ (2<x<2.4); (4) TiSi$_2$; (5) Al—Sc(~0.1–~0.3%); (6) TiN; (7) TiW; (8) Tungsten; (9) Al(~1%)—Si(~1%)—Cu; (10) Al(~1%)—Si (~0.5%)—Sc; (11) Titanium; and (12) Ti(~0–~25%)—Al, taken singularly or in combination with one another.

9. A process for filing a cavity in a semiconductor body, comprising the steps of:
   providing a body for a semiconductor device, said body comprising a polymetric dielectric having a dielectric constant less about 2.6, said body having an upper surface and at least one cavity which extends from said surface at least partially into said body, said cavity being defined by a cavity wall and having an open end;
   depositing a composite cavity liner along at least a portion of said cavity wall, said composite cavity liner being comprised of at least first and second overlying metal-containing layers that are applied sequentially such that said second liner layer overlies at least a portion of said first liner layer; and applying a cavity fill metal under positive pressure into said cavity at a temperature below the melting point of said metal-containing layers.

10. The process according to claim 9, further comprising forming a groove in said dielectric, filling said groove with a metal, and rendering said metal in said groove substantially coplanar with a surface of said dielectric.

* * * * *